United States Patent
Manapat et al.

(10) Patent No.: US 7,006,404 B1
(45) Date of Patent: Feb. 28, 2006

(54) MEMORY DEVICE WITH INCREASED DATA THROUGHPUT

(75) Inventors: Rajesh Manapat, San Jose, CA (US); Ritesh Mastipuram, Santa Clara, CA (US); Kannan Srinivasagam, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/810,038

(22) Filed: Mar. 26, 2004

(51) Int. Cl.
*G11C 8/00* (2006.01)

(52) U.S. Cl. .................. 365/233; 365/189.05

(58) Field of Classification Search .......... 365/233, 365/198.01, 189.04, 189.02, 230.02, 230.06, 365/230.08
See application file for complete search history.

(56) References Cited

U.S. PATENT DOCUMENTS 5,657,292 A * 8/1997 McClure .............. 365/233
6,728,157 B1 * 4/2004 Yagishita et al. ........ 365/222

OTHER PUBLICATIONS

Cypress Data Sheet: 18-Mb QDR-II SRAM 2-Word Burst Architecture, Jan. 23, 2004.

\* cited by examiner

*Primary Examiner*—Thong Q. Le
(74) *Attorney, Agent, or Firm*—Bradley T. Sako

(57) ABSTRACT

A memory device (200) can include memory cell arrays (202-*a* and 202-*b*) accessed according to phase shifted clock signals. Memory cell array (202-*a*) can be accessed at double data rates essentially synchronous with clock signal CLK. Memory cell array (202-*b*) can be accessed at double data rates essentially synchronous with a phase delayed clock signal DCLK. Such an arrangement can provide eight data accesses (four reads and four writes) in a single clock cycle.

20 Claims, 7 Drawing Sheets

MEMORY DEVICE WITH INCREASED DATA THROUGHPUT

TECHNICAL FIELD

The present invention relates generally to memory devices, and more particularly to an architecture and method for increasing data throughput in a memory device.

BACKGROUND OF THE INVENTION

Conventional memory devices, such as standard static random access memories (SRAMs), including both synchronous and asynchronous types, can provide the fast performance needed for many applications. However, other applications can have a need for even higher data throughput rates. As but one example, in many network hardware devices there is a need for memory devices having an even higher data throughput rate.

One type of memory device developed to meet high throughput applications is the Quad Data Rate™ or QDR™ SRAM (such as those manufactured by Cypress Semiconductor Corporation, of San Jose, Calif.). To better understand various features of the embodiments of the present invention, examples of QDR™ SRAMs will now be described.

A block diagram of one example of a QDR™ SRAM is set forth in FIG. 8, and designated by the general reference character 800. As shown in FIG. 8, a QDR™ SRAM can receive write data D via one port and output read data Q via another port. Further, such data can be read or written at a "double" data rate. Thus, four data operations (e.g., two reads and two writes) can occur in a single clock cycle.

Referring still to FIG. 8, addresses (A) and write data (D) can be latched on both rising and falling edges of a clock signal (CLK and its complement CLK#). An active low read pulse RPS# can indicate a read operation, while an active low write pulse WPS# can indicate a write operation. Read data (Q) can be output in synchronism with an "echo" clock (CQ and its complement CQ#). An echo clock (CQ) may be synchronous with another clock signal (not shown), or can be synchronous with clock signal CLK in a "single" clock mode of operation.

A more detailed example of a QDR™ SRAM is shown in FIGS. 9A and 9B. FIG. 9A is a block schematic diagram designating the QDR™ SRAM by the general reference character 900. The QDR™ SRAM 900 includes a memory cell array 902 with two sections (904-a and 904-b). The memory cell array 902 can be accessed in a write operation according to a write address decoder 906 and in a read operation according to a read address decoder 908.

In a write operation, write data D[7:0] can be applied to memory cell array 902 by way of a write register, that includes write registers 910-a and 910-b for writing data to sections (904-a and 904-b), respectively. Write data D[7:0] can be received on a write bus 912. A write address A[19:0] received on address bus 914 can be latched in a write address register 916 and applied to write address decoder 906.

In a read operation, a read address A[19:0] received on address bus 914 can be latched in a read address register 918 and applied to read address decoder 908. Read data Q[7:0] can be output by way of a read register 920 through data registers 922-a to 922-c onto read data bus 924.

Timing of operations within QDR™ SRAM 900 can be controlled according to clock generator 926. Clock generator 926 can receive a clock signal K and its complement K#. Further, control signals for such operations can be generated by control circuits 928 and 930. As shown in FIG. 9A, control circuit 928 can receive a reference voltage Vref, which can be used to distinguish a logic high from a logic low, a write pulse WPS#, and byte write select signals BWS#[1:0]. Control circuit 930 can receive a read pulse RPS#, and optionally, an output clock signal C and its complement C#.

FIG. 9B is a timing diagram showing the operation of the QDR™ SRAM of FIG. 9A.

Referring now to FIG. 9B in conjunction with FIG. 9A, at time t0, clock signal K can transition high. At this time both a write pulse WPS# (which is active low) and a read pulse RPS# (which is also active low) can be low. In response to such control signals QDR™ SRAM 900 can latch a read address (A0) present on address bus 914 on the rising edge of clock signal K. In addition, the QDR™ SRAM 900 can prepare to latch a write address on the next falling edge of clock signal K (or rising edge of complementary clock signal K#). At the same time, a first write data value (D10) on write data bus 912 can be latched within write address register 910-a.

At time t1, clock signal K can transition low (while complementary clock signal K# transitions high). Because write pulse WPS# was low at time t0, QDR™ SRAM 900 can latch a write address (A1) present on address bus 914 on the falling edge of clock signal K. At this time, a second write data value (D11) on write data bus 912 can be latched within write address register 910-b.

In a similar fashion to times t0 and t1, at times t3 and t4 another read address A2 and another write address A3 can be latched, respectively. Further, at times t4 and t5 a third read address A4 and write address (the same address A4) can be latched.

As illustrated by the single clock signal cycle between times t3 and t5, as write data D40 and D41 are being input, read data Q00 and Q01 (corresponding to read address A0) can be output. Hence a "quadruple" data throughput rate can be achieved.

While QDR™ SRAMs and similar memory devices can provide a high data throughput speed for memory access intensive applications, such as network search engines and the like, there is always a need for even higher throughput devices in order to improve the performance of such systems even further.

In light of the above, it would be desirable to arrive at some way of increasing that data throughput of a memory device beyond that of conventional QDR™ SRAMs and similar memory devices.

SUMMARY OF THE INVENTION

The present invention can include a memory device with a first memory cell array coupled to a read data bus that outputs read data, and coupled to a separate write data bus that inputs write data. A first memory cell array can access read data in response to a first type edge of a first clock and can latch write data on the first type edge of the first clock. The memory device can also include a second memory cell array coupled to the read data bus and write data bus. The second memory cell array can access read data in response to a first type edge of a second clock and latch write data on the first type edge of the second clock. The second clock can be phase shifted with respect to the first clock by less than 180°.

In such an arrangement, multiple memory cell arrays can be accessed according to phase shifted clocks resulting in an increase in data throughput in a given clock cycle. This is in contrast to arrangements that access a memory cell array at only double data rates.

According to one aspect of the embodiments, first and second memory cell arrays can include a plurality of sections, each having n×m memory cells. A write data bus can include m input data lines.

In such an arrangement, data for each memory cell array can be written in multiple data words of size m.

According to another aspect of the embodiments, first and second memory cell arrays can comprise static random access memory (SRAM) cells.

Such an arrangement can allow for rapid access to data values.

According to another aspect of the embodiments, the second clock is synchronous with, and phase shifted by about 90° with respect to the first clock.

According to another aspect of the embodiments, a first memory cell array can latch write data on both the first and second type edges of the first clock. A second memory cell array can latch write data on both first and second type edges of the second clock.

In such an arrangement, a first memory cell array can receive write data at a double data rate, while another memory cell array can also receive data at a double data rate, but phase shifted with respect to the write data for the first memory cell array.

According to another aspect of the embodiments, a memory device may further include a first address latch coupled between the address bus and the first memory cell array that latches an address value in response to the first type edge of the first clock to provide an internal address. In addition, a second address latch can be coupled between the first address latch and the second memory cell array, and can latch the internal address value on in response to the first type edge of the phase shifted second clock.

In such an arrangement, a same input address can be applied to different memory cell arrays in a phase shifted manner.

According to another aspect of the embodiments, a memory device may further include a multiplexer having one input coupled to the first memory cell array and another input coupled to the second memory cell array. The multiplexer can output read data at a rate that is at least four times that of the first clock signal.

In this way, phase shifted accesses to different memory cell arrays can result in greater than double data rate read accesses.

According to another aspect of the embodiments, a memory device can include a first write address decoder coupled to the first memory cell array and a first write address register coupled to an address bus. The first write address register can have an output coupled to a first write address decoder. The memory device can further includes a second write address decoder coupled to the second memory cell array and a second write address register coupled to the first write address register. The second write address register can have an output coupled to a second write address decoder.

In this way, phase shifted accesses to different memory cell arrays can result in greater than double data rate write accesses.

The present invention may also include a memory device having a number of N memory cell arrays (where N>1). Each memory cell array can include at least two sections. A first write register can latch write data for a first of section of a first memory cell array on a rising edge of a first clock signal and can latch write data for a second section of the first memory cell array on a falling edge of the first clock signal. In addition, a second write register can latch write data for a first section of a second memory cell array on a rising edge of a second clock signal and can latch write data for a second section of the second memory cell array on a falling edge of the second clock signal. The second clock signal can have essentially the same frequency as the first clock signal, but can be phase shifted with respect to the first clock signal by about 180°/N.

In this way, multiple memory cell arrays can be accessed for read operations according to phase delayed clock signals.

According to another aspect of the embodiments, the number N is 2.

According to another aspect of the embodiments, each memory cell array includes M sections. Further, a first memory cell array and second memory cell array provide a burst of M read data values in response to one read address.

In this way, multiple memory cell arrays accessed in phase shifted manner can each provide read data for burst output.

According to another aspect of the embodiments, a memory device may further include a read output register circuit that receives M read data values from each memory cell array, and outputs such data values as N*M words in series at a different phase with respect to one another.

In this way, data throughput can be increased over conventional approaches.

According to another aspect of the embodiments, a memory device can further include an address latch corresponding to each memory cell array, each address latch being arranged in series in a predetermined order and latching an address value according to a phase delay with respect to a previous address latch in the series. The phase delay can be about 180°/N.

According to another aspect of the embodiments, a memory device can further include a multiplexer for outputting read data from the memory cell arrays at a frequency of N*F, where F is the frequency of the first and second clock signals.

The present invention may also include a method of increasing data throughput in a memory device. The method can include accessing a first of N memory cell arrays on a first-type edge and second-type edge of a first clock signal in response to one address value, accessing a second of the N memory cell arrays on a first-type edge and second-type edge of a second clock signal in response to the same address value. The second clock signal can have essentially the same frequency as the first clock signal but be phase shifted with respect to the first clock signal by about 180°/N. The method may further include latching read addresses on different type edges of the first clock signal than a write addresses.

Such an arrangement can increase data throughput in memory devices over conventional quad data rate arrangements by phase shifting accesses to multiple memory cell arrays.

According to another aspect of the embodiments, the method can include, in a read operation, latching a read address on first-type edges of the first clock and latching write addresses on second-type edges of the first clock. Further, the step of accessing the second memory cell array can include latching a read address on first-type edges of the second clock and latching write addresses on second-type edges of the second clock.

In such an arrangement, read addresses can be applied in phase shifted manner to different memory cell arrays.

According to another aspect of the embodiments, the method can include, in a burst mode, accessing each of M sections of the first memory cell array in synchronism with different first-type and second-type edges of the first clock, and accessing each of M sections of the second memory cell array in synchronism with different first-type and second-type edges of the second clock.

Such an arrangement can allow phase shifted burst accesses to different memory cell arrays.

According to another aspect of the embodiments, the method can include, in a read operation, outputting N*M read data values within the duration of a first clock signal cycle in response to a single read address.

According to another aspect of the embodiments, the method can include, in a read operation, outputting a data value in synchronism with an output clock having essentially the same frequency as the first clock signal. The read data can be output from a different memory cell array with about a 180°/N phase shift with respect to the output clock.

According to another aspect of the embodiments, the method can include, in a write operation, latching write data on first-type edges and second-type edges of the first clock, and latching write data on first-type edges and second-type edges of the second first clock.

DETAILED DESCRIPTION

Various embodiments of the present invention will now be described in detail with reference to a number of drawings. The embodiments include a memory device having a high data throughput that accesses different memory cell arrays on different phases of two different synchronous clock signals.

Figure 1:
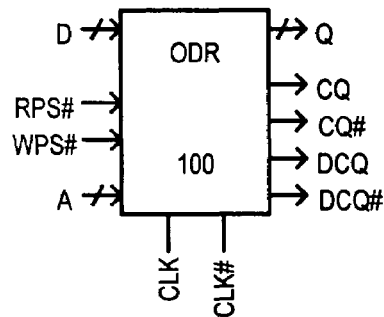
FIG. 1 is a block schematic diagram of a first embodiment of the present invention.

Referring now to FIG. 1, a memory device according to a first embodiment is set forth in a block schematic diagram and designated by the general reference character 100. A memory device 100 can receive write data (D) via one port and output read data (Q) via another port. Unlike conventional QDR™ memory configurations, read data can be output at rates greater than a "double" data rate. As will be described in more detail below, in the particular example of FIG. 1, data can be both read and written at a quadruple data rate. Thus, eight data operations (e.g., four reads and four writes) can occur in a single clock cycle.

In operation, a memory device can latch both addresses (A) and write data (D) on rising and falling edges of a clock signal (CLK and its complement CLK#). Further, an active low read pulse RPS# can indicate a read operation, while an active low write pulse WPS# can indicate a write operation.

However, as noted above, read data (Q) can be output at a "quadruple" data rate. More particularly, read data (Q) may be output in synchronism with both a first "echo" clock (CQ and its complement CQ#), as well as a second, phase shifted echo clock (DCQ and its complement DCQ#). An echo clock (CQ) may be synchronous with an applied "output" clock signal (not shown), or can be synchronous with clock signal CLK in a "single" clock mode of operation. A second echo clock (DCQ/DCQ#) can be essentially synchronous with an echo clock (CQ) but phase shifted with respect to such a clock.

In one particular example, a second echo clock signal (DCQ) can be phase shifted by less than 180°, more particularly by about 90° with respect to first echo clock signal (CQ). It follows that a second complementary echo clock signal (DCQ#) can be phase shifted by about 90° with respect to first complementary echo clock signal (CQ#).

In this way, within one clock signal (CLK) cycle, four write data values can be input while four read data values are output. Thus, an "octuple" data throughput rate can be achieved. This can provide twice the data throughput as a conventional QDR™ memory operating at the same clock speed.

Figure 2A:
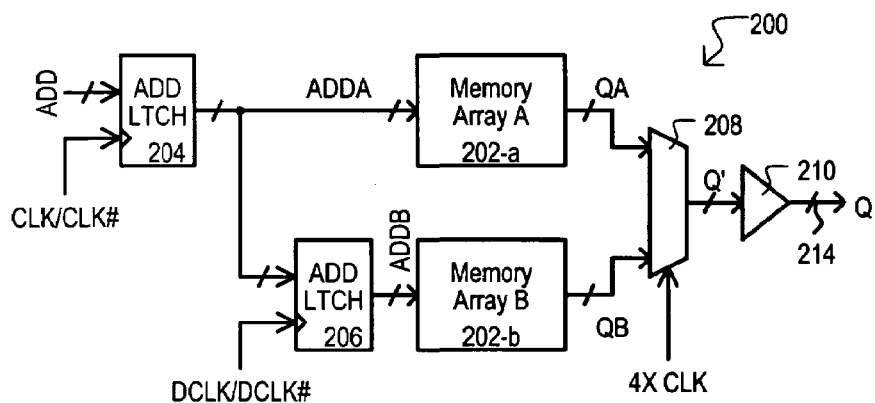
FIG. 2A is a block schematic diagram of a second embodiment of the present invention.

Referring now to FIG. 2A, a memory device according to a second embodiment is set forth in a block schematic diagram, and designated by the general reference character 200. A memory device 200 can include multiple memory cell arrays (202-a and 202-b), an input address latch 204, an internal address latch 206, an output multiplexer 208, and an output buffer 210.

Input address latch 204 can latch an address value ADD on an address bus 212 in response to a rising edge of a clock signal CLK to provide an internal address ADDA. Internal address ADDA can be provided to memory cell array 202-a and to internal address latch 206. Internal address latch 206 can latch internal address ADDA in response to a rising edge of phase shifted clock signal DCLK to provide phase shifted internal address ADDB to memory cell array 202-b.

In this way address latches 204 and 206 can be arranged in series, and latch address values at a predetermined phase delay with respect to one another. In this particular example, such a phase delay can be about 90°.

In response to address value ADDA, latched by clock signal CLK, memory cell array 202-a can output data values QA. Similarly, in response to address values ADDB, latched in response to clock signals DCLK, memory cell array 202-b can output data values QB. In the very particular example of FIG. 2B, output data value QA can include enough data for a two word burst, and thus can include data values Q0A and Q1A, shown collectively as Q0/1A. Output data value QB can also include enough data for a two word burst, and thus can include data values Q0B and Q1B.

Output multiplexer 208 can output data (QA and QB) provided from both memory cells arrays (202-a and 202-b). An output data rate can be at least twice as fast as a clock rate. For example, it will be assumed that clock DCLK is phase shifted by 90° with respect to clock CLK (thus clock DCLK# is phase shifted by 900 with respect to clock CLK#). In such a case, data QA provided by memory cell array 202-*a* can be provided at about 0° and 180° from one another, while data QB provided by memory cell array 202-*b* can be provided at about 90° and 2700 from one another. Thus, data can be provided at a rate four times that of clock signal CLK.

FIG. 2A shows output multiplexer 208 operating according to a "4× CLK" signal. As will be described in a different embodiment, an output multiplexer may operate according to a 2× clock (PCLK) that outputs one set of data when high (e.g., QA) and another set of output data (e.g., QB) when low.

A buffer 210 can amplify, or otherwise condition, data output (Q') from output multiplexer 208 to provide output data Q on read data bus 214.

Figure 2B:
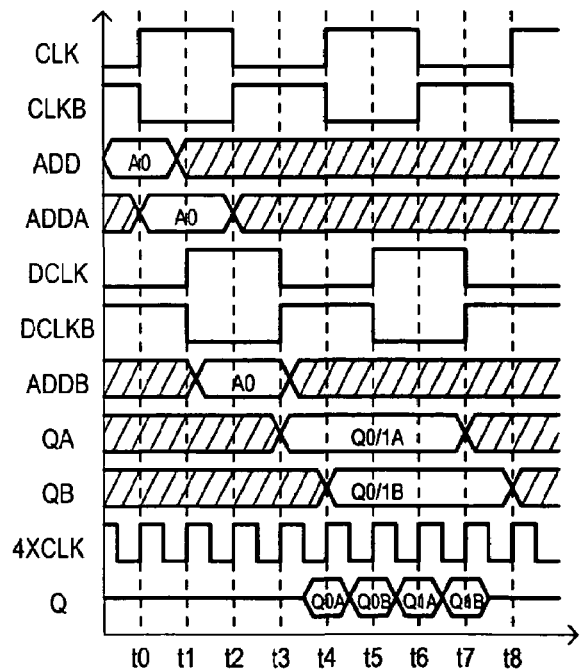
FIG. 2B is a timing diagram showing the operation of the embodiment of FIG. 2A.

The operation of the memory device of FIG. 2A will now be described with reference to FIG. 2A in conjunction with FIG. 2B.

At time t0, clock signal CLK can transition high while address A0 is present on address bus 212. Address A0 can thus be latched by input address latch 204 and provided as internal address ADDA between times t0 and t2. Memory cell array 202-*a* can be accessed according to address A0, resulting in read data being output according to a predetermined latency (which in this case is one clock cycle).

At time t1, phase shifted clock signal DCLK can transition high. Thus, internal address ADDA (which is A0 at this time) can be provided as internal address ADDB between times t1 and t3. Memory cell array 202-*b* can be accessed according to address A0 resulting in read data being output according to the predetermined latency.

In response to address A0, memory cell array (202-*a*) can provide read data values Q0A and Q1A, respectively. Such data can be provided at a "double" data rate, with both data values (Q0A and Q1A) being output within one clock cycle. Similarly, in response to address A0, memory cell array (202-*b*) can provide read data values Q0B and Q1B, respectively. Again, such data can be provided at a "double" data rate, with both data values (Q0B and Q1B) being output within one clock cycle, but phase shifted with respect to data values (Q0A and Q1A). In the example shown, such a phase shift is about 90°.

Output data Q can be provided at a quadruple data rate from alternate arrays by output multiplexer 208. Thus, data value Q0A from memory cell array 202-*a* can be output at about time t4. A predetermined phase delay later (e.g., 90°), data value Q0B from memory cell array 202-*b* can be output at about time t5. After a next phase delay, a data value Q1A, from memory cell array 202-*a*, can be output at about time t6. Then, following a next phase delay, a data value Q1B, from memory cell array 202-*b*, can be output from memory cell array 202-*b* at about time t7.

In this way, a memory cell device may output read data at a quadruple data rate on a read data bus that is different than a write data bus.

Figure 3A:
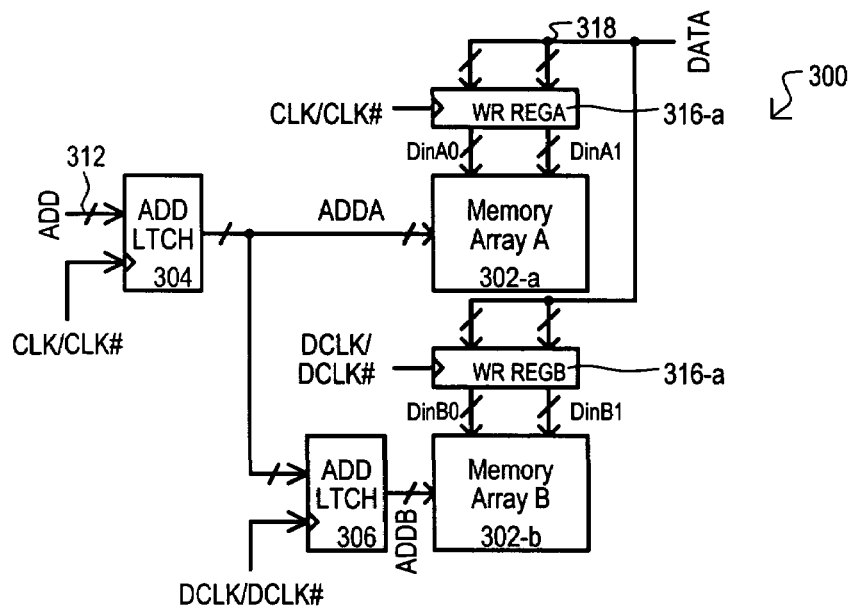
FIG. 3A is a block schematic diagram of a third embodiment of the present invention.

Referring now to FIG. 3A, a memory device according to a third embodiment is set forth in a block schematic diagram, and designated by the general reference character 300. A memory device 300 can include similar items to those shown in FIG. 2A. Such like items will be referred to by the same reference character but with a first digit being a "3" instead of a "2". Thus, memory device 300 can include multiple memory cell arrays (302-*a* and 302-*b*), address latch 304, internal address latch 306, a write register 316-*a* corresponding to memory cell array 302-*a*, and a write register 316-*b* corresponding to memory cell array 302-*b*.

Input address latch 304 can latch an address value ADD on an address bus 312 in response to a falling edge of a clock signal CLK (i.e., rising edge of its complement CLK#) to provide an internal address ADDA. Internal address ADDA can be provided to memory cell array 302-*a* and to internal address latch 306. Internal address latch 306 can latch internal address ADDA in response to a falling edge of phase shifted clock signal DCLK (i.e., rising edge of its complement DCLK#), to provide phase shifted internal address ADDB to memory cell array 302-*b*.

Write register 316-*a* can latch write data on a write data bus 318 in response to rising edges of both clock CLK and its complement CLK#. Write data stored in write register 316-*a* can be applied as input data values DinA0 and DinA1 to memory cell array 302-*a*. Similarly, write register 316-*b* can latch write data on a write data bus 318 in response to rising edges of both phase shifted clock DCLK and its complement DCLK#. Write data stored in write register 316-*b* can be applied as input data values DinB0 and DinB1 to memory cell array 302-*b*.

In the above described arrangement, write registers (316-*a* and 316-*b*) can input data at a faster rate than a clock signal CLK. For example, it will be assumed that clock DCLK is phase shifted by 90° with respect to clock CLK (and thus clock DCLK# is phase shifted by 90° with respect to clock CLK#). In such a case, first write data values can be input at about 0° and 180° from one another, while second write data values can be input at about 90° and 270° from one another. Thus, data can be input at a rate four times that of clock signal CLK.

Figure 3B:
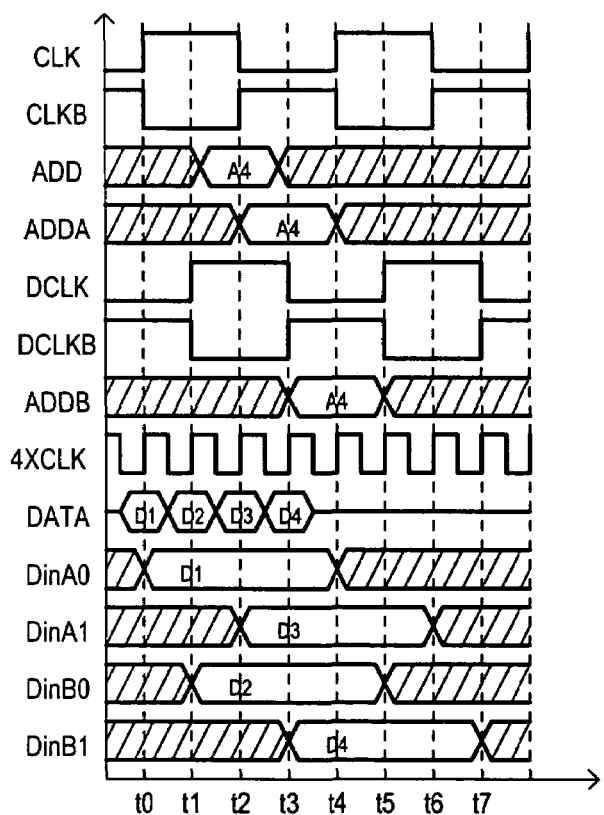
FIG. 3B is a timing diagram showing the operation of the embodiment of FIG. 3A.

The operation of the memory device of FIG. 3A will now be described with reference to FIG. 3A in conjunction with FIG. 3B.

At time t0, clock signal CLK can transition high while a write data value D1 is present on write data bus 318. Data value D1 can thus be latched by write register 316-*a* and provided as input write data value DinA0.

At time t1, phase shifted clock signal DCLK can transition high while a second write data value D2 is present in write data bus 318. Thus, data value D2 can be latched by write register 316-*b* and provided as input write data value DinB0.

At time t2, clock signal CLK can transition low while a write data value D3 is present on write data bus 318. Data value D3 can thus be latched by write register 316 a and provided as input write data value DinA1. Thus, at this time write data values D1 and D3 (which can represent a two-word burst in this case), can be written into memory cell array 302-*a*.

In a similar fashion, at time t3, clock signal DCLK can transition low while a write data value D4 is present on write data bus 318. Data value D4 can thus be latched by write register 316-*b* and provided as input write data value DinB1. Thus, at this time write data values D2 and D4 (which can represent another two-word burst), can be written into memory cell array 302-*b*.

In this way, input write data DATA can be provided at a quadruple data rate to alternate arrays by operation of write registers (316-*a* and 316-*b*). That is, first data value D1 can be latched at about time t0. A predetermined phase delay later (e.g., 90°), data value D2 can be latched. After a next phase delay, a data value D3 can be latched. Then, following a next phase delay, a data value D4 can be latched.

In this way, a memory cell device may input write data at a quadruple data rate on a write data bus that is different than a read data bus.

One skilled in the art would understand that by combining the operations shown in FIGS. 2A to 3B, a memory device can provide octuple data rate throughputs enabling four data values to be read and four data values to be written within one clock cycle.

Figure 4A:
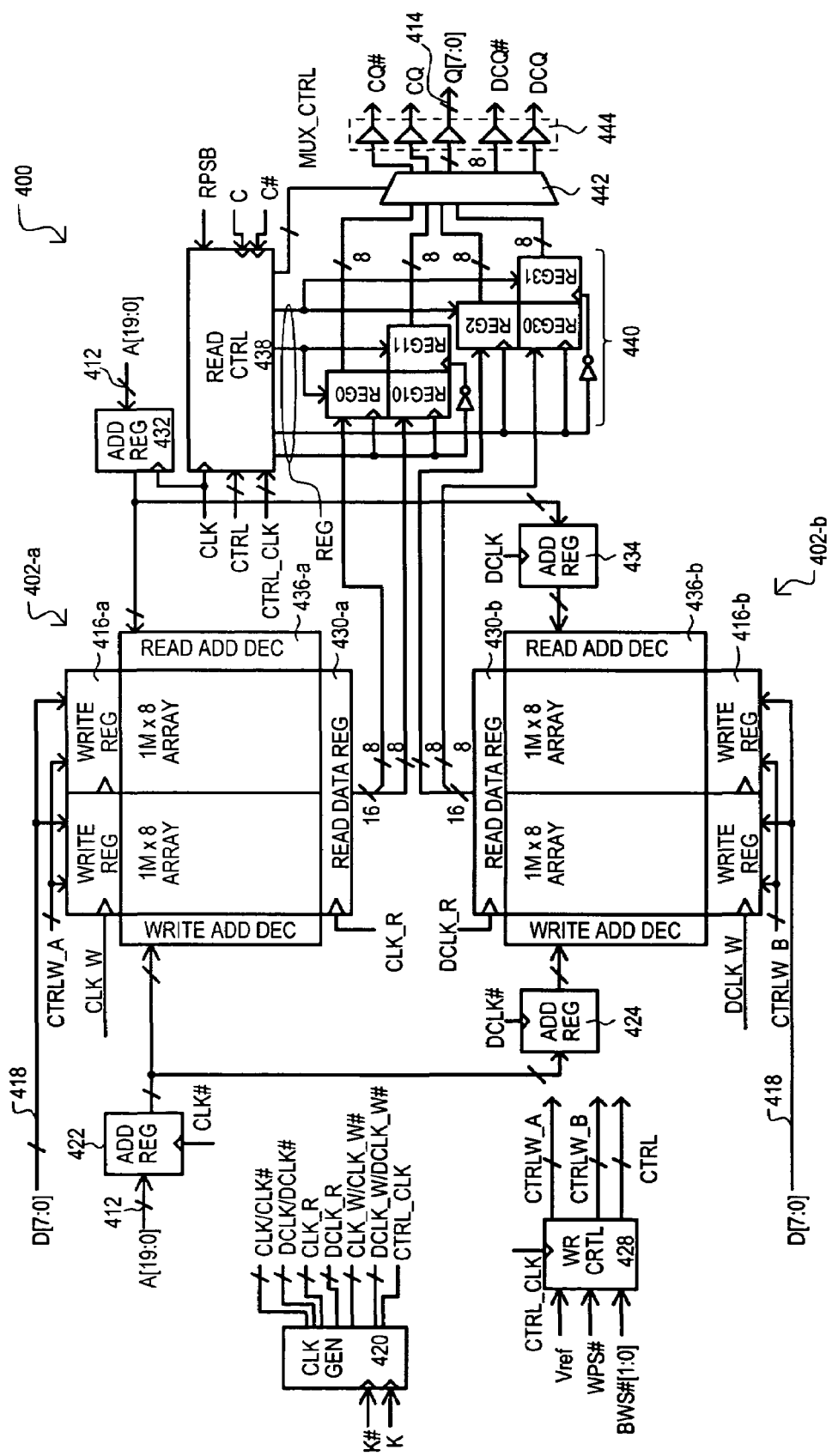
FIG. 4A is a block schematic diagram of a fourth embodiment of the present invention.

Referring now to FIG. 4A, a memory device according to a third embodiment is set forth in a block schematic diagram, and designated by the general reference character 400. A memory device 400 can include similar items to those shown in FIGS. 2A and 3A. Such like items will be referred to by the same reference character but with a first digit being a "4" instead of a "2". Thus, memory device 400 can include multiple memory cell arrays (402-*a* and 402-*b*), an address bus 412, a read data bus 414, write registers 416-*a* and 416-*b*, and write data bus 418.

Memory device 400 can also include a clock generator circuit 420, a write address registers 422, an internal write address register 424, write address decoders (426-*a* and 426-*b*), and write control circuit 428. Memory device 400 can further include read data registers (430-*a* and 430-*b*), read address register 432, internal read address register 434, read address decoders (436-*a* and 436-*b*), a read control circuit 438, a read output register circuit 440, multiplexer 442 and buffers 444.

A clock generator 420 can generate internal clock signals for timing accesses to memory cell arrays (402-*a* and 402-*b*). In the very particular example of FIG. 4A, a clock generator 420 can receive a clock signal K (and its complement K#) and generate therefrom various source synchronous (but sometimes phase shifted) clock signals.

Such clock signals include CLK, CLK_R, and CLK_W (and corresponding complements CLK#, and CLK_W#) for latching addresses and accessing first memory cell array 402-*a*, as well as phase shifted clock signals DCLK, DCLK_R, and DCLK_W (and corresponding complements DCLK#, and DCLK_W#) for latching addresses and accessing second memory cell array 402-*b*. In addition, clock signal CTRL_CLK can be provided for control circuits 428 and 438.

A write control circuit 428 can receive a reference voltage Vref, a write pulse input WPS#, and byte write select signals (BWS#[1:0]). In response to such inputs, write control circuit 428 can generate write control signals CTRLW_A for write register 416-*a* and write control signals CTRLW_B for write register 416-*b*. It is understood that such control signals can include the reference voltage Vref, as well as control signals for selecting/de-selecting a byte for a given write operation. Write control circuit 428 can also forward additional control signals CTRL to read control circuit 438.

A read control circuit 438 can receive a read pulse signal RPS#, as well as an optional output clock signal C (and its complement C#). In response to such inputs, a read control circuit 438 can generate register control signals REG as well as a multiplexer control signals MUX_CTRL. Register control signals REG can clock out read data from output register circuit 440 in a phase shifted manner, according to clock K or C, depending upon the mode of operation. Multiplexer control signals MUX_CTRL can output such read data as a series of data words. Again, the timing of such data can be synchronous with clock K or C, depending upon the mode of operation.

Having described the general components of a memory device according to a fourth embodiment 400, the operation of the fourth embodiment 400 will now be described in conjunction with FIG. 4B.

Figure 4B:
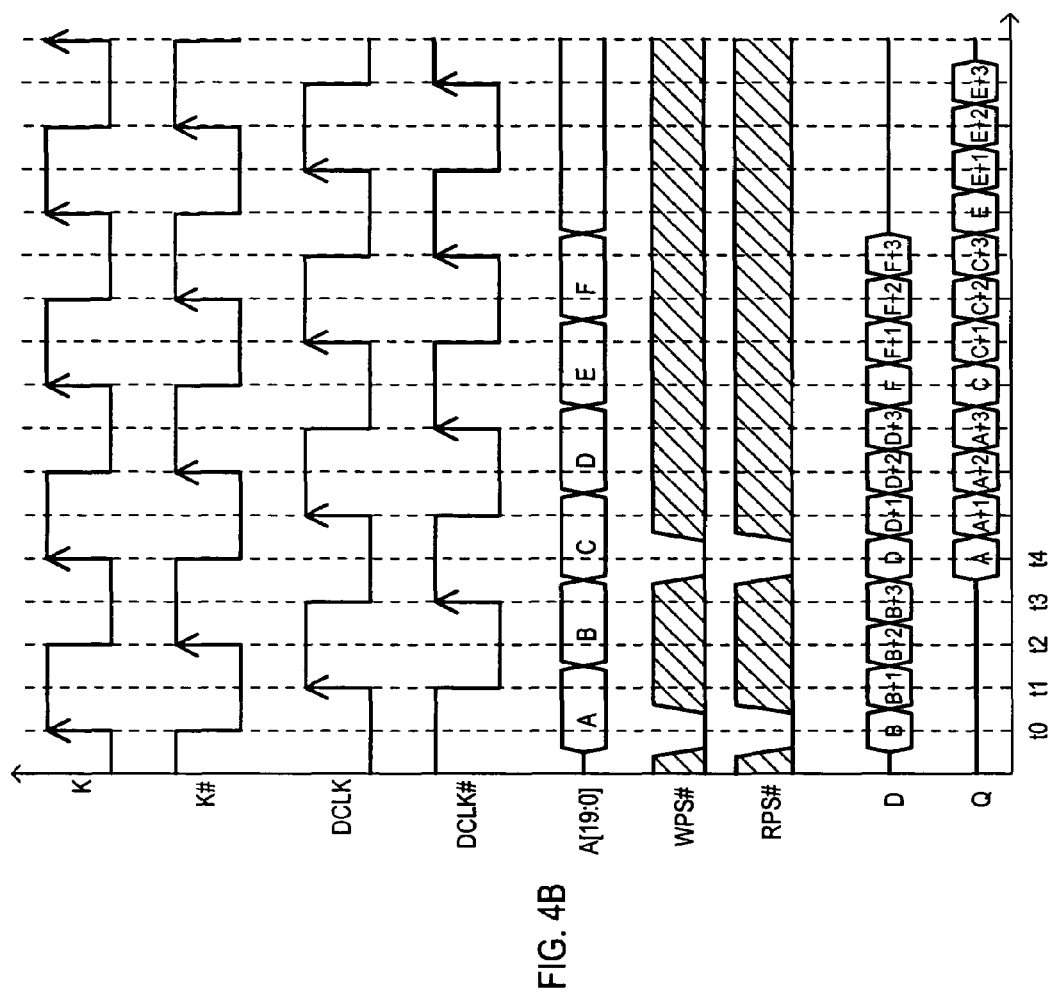
FIG. 4B is a timing diagram showing the operation of the embodiment of FIG. 4A.

Referring to FIGS. 4A and 4B, at time t0, input clock signal K can transition high while address value A is present on address bus 412. A read pulse value RPS# can be active (low), indicating a read operation is to be executed according to the current address. Further, a write pulse value WPS# can also be active (low), indicating a write operation is to be executed according to a next latched address.

According to clock signal CLK, a read address A can be stored in read address register 432 and provided to read address decoder 436-*a*. Read address decoder 436-*a* can decode the address value and thus access memory cell array 402-*a* to thereby generate read data values A and A+2 a predetermined time later. Such read data values A and A+2 can be subsequently output from read data register 430-*a* according to clock signal CLK_R.

At the same time, write data B can be present in write data bus 418. Such a data value can be latched within write register 416-*a*, according to clock signal CLK_W, which can be essentially synchronous with clock signal CLK. Such a latching of write data can be conditioned on write control signals CTRL_A, which can include byte write selection data.

At time t1, phase delayed clock signal DCLK can transition high. According to such a signal, read address A from read address register 432, can be stored in internal read address register 434 and provided to read address decoder 436-*b*. Read address decoder 436-*b* can decode the address value to access memory cell array 402-*b*, and thereby generate read data values A+1 and A+3 a predetermined time later. Such read data values A+1 and A+3 can be subsequently output from read data register 430-*b* according to clock signal DCLK_R.

At the same time, write data B+1 can be present in write data bus 418. Such a data value can be latched within write register 416-*b*, according to clock signal DCLK_W. Such a latching of write data can be conditioned on write control signals CTRL_B, which can include byte write selection data.

At time t2, input clock signal K can transition low (and its complement K# can transition high). According to clock signal CLK#, a write address B can be stored in write address register 422 and provided to write address decoder 426-*a*.

At the same time, write data B+2 can be present in write data bus 418. Such a data value can be latched within write register 416-*a*, according to clock signal CLK_W (or its complement CLK_W#). Again, such a latching of write data can be conditioned on write control signals CTRL_A.

Subsequently, write address decoder 426-*a* can decode the address value B, and data values B and B+1 can be written into memory cell array 402-*a*.

At time t3, clock signal DCLK can transition low (and its complement DCLK# can transition high). According to clock signal DCLK#, a write address B can be stored in internal write address register 424 and provided to write address decoder 426-*b*.

At the same time, write data B+3 can be present in write data bus 418. Such a data value can be latched within write register 416-*b* according to clock signal DCLK_W (or its complement DCLK_W#). Again, such a latching of write data can be conditioned on write control signals CTRL_B.

Subsequently, write address decoder 426-*b* can decode the address value B, and data values B and B+1 can be written into memory cell array 402-*b*.

Starting a time t4, the same essential process can repeat, with a read address C followed by write address D, and read address E followed by write address F.

Also at time t4, read data corresponding to read address A can be output on subsequent phases (in this case about 90°), as read data A, A+1, A+2 and A+3. Referring to FIG. 4A, in read output register circuit 440, read data A can be output from register REG0, read data A+1 can be output by register REG2, read data A+2 can be output from register REG11, and read data A+3 can be output by register REG31.

Such data values can be output at a different phase relationship with respect to one another. For example, data value A may be output according to a clock synchronous with output clock signal C (or K), data value A+1 may be output according to a phase shifted output clock signal (i.e., DC) (or DCLK), data value A+2 may be output according to a clock synchronous with output clock signal C# (or K#), and data value A+3 may be output according to a phase shifted output clock signal (i.e., DC#) (or DCLK#).

Looked at in another way, read output register circuit 440 can receive two words of data (in this case 16-bits) from both two memory cell arrays (402-*a* and 402-*b*), and provide 2*2=4 words of data, each at a different phase relationship with respect to one another.

Multiplexer 442 can receive phase delayed read data values (e.g., A, A+1, A+2 and A+3), and output such data as read data Q[7:0] during separate phases of one clock cycle period. In addition, a multiplexer 442 can provide an echo clock CQ (and its complement CQ#) as well as a phase shifted echo clock DCQ (and its complement DCQ#). Such echo clocks can be generated in response to output clocks C and C#, or in a single clock mode, in response to input clocks K and K#. Such read data and echo clocks can be buffered by buffers 444.

Referring still to FIG. 4A, it is noted that each memory cell array (402-*a* and 402-*b*) can include two sections, each formed of a 1 M×8 array. In this arrangement, data may be output from both sections for a total of 16 bits. However, such 16-bits can be output in a burst of two 8-bit words. Such an arrangement should not necessarily be construed as limiting the invention thereto. For example, the operation of the embodiment of FIG. 4 may be conceptualized by considering each memory cell array to include M sections, where M is two or more. In such an arrangement, a read operation may access M words, and such words can be output in bursts of M. Due to the phase shift arrangement between memory cell arrays, such an access can result in a 2*M data rate.

In this way, embodiments of the present invention can provide larger burst sizes than just 2.

Figure 5A:
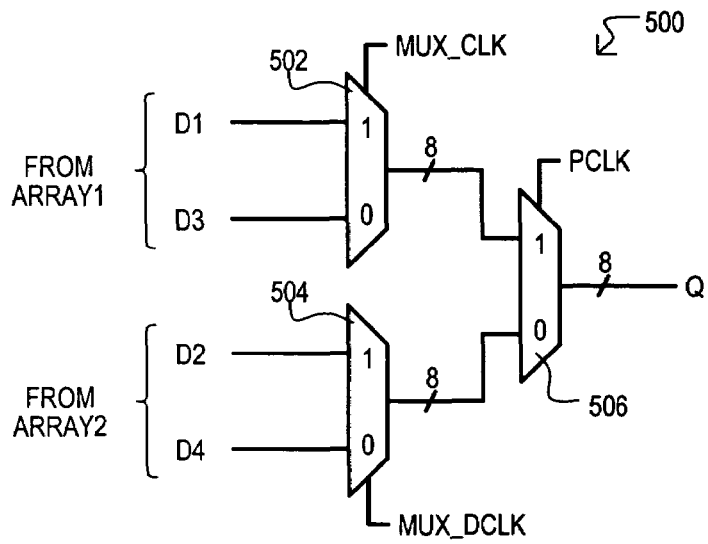
FIG. 5A is a block schematic diagram showing a portion of a read data multiplexer according to an embodiment of the present invention.

Referring now to FIG. 5A, one example of a portion of a multiplexer like that shown as 442 in FIG. 4 is set forth in a block schematic diagram, and designated by the general reference character 500. A multiplexer circuit 500 shows a data path section, and can include a first input multiplexer (MUX) 502 that receives data values D1 and D3 (from a first array), a second input MUX 504 that receives data values D2 and D4 (from a second array), and an output MUX 506 that provides an output data value Q. First input MUX 502 can be controlled according to a clock MUX_CLK, second input MUX 504 can be controlled according to a phase shifted clock MUX_DCLK, and output MUX 506 can be controlled according to output clock PCLK.

Clock MUX_CLK can be synchronous with an output clock C in one mode, and with input clock K in another (single clock) mode. Clock MUX_CLK can be synchronous with a phase shifted output clock (DC) in one mode, and with phase shifted clock DCLK in the other (single clock) mode. Output clock PCLK can run at two time the speed of output clock C in one mode, and two times the speed of input clock K in the other (single clock) mode.

Figure 5B:
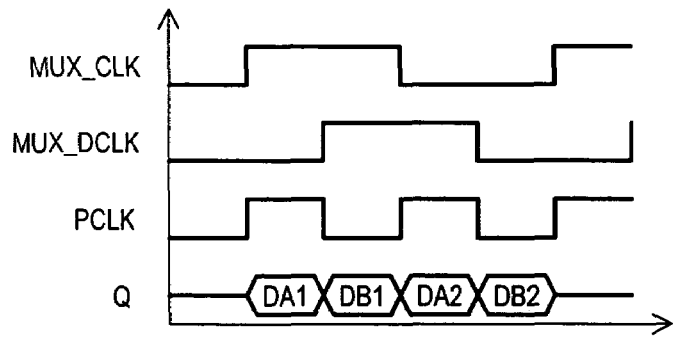
FIG. 5B is a timing diagram showing the operation of the multiplexer of FIG. 5A.

The operation of multiplexer circuit 500 is shown in a timing diagram in FIG. 5B. As shown in the figure, four read data values D1, D2, D3 and D4 can be output in one clock cycle.

As would be understood by one skilled in the art, an output clock PCLK can be generated by frequency multiplying a clock MUX_CLK by two.

Figure 6:
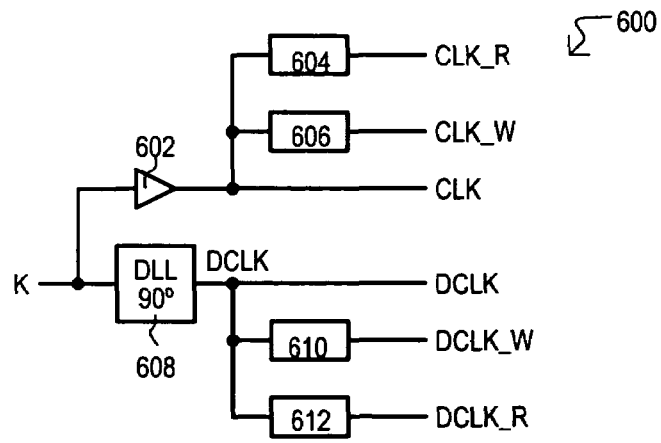
FIG. 6 is a block schematic diagram of a portion of a clock generator circuit according to one embodiment of the present invention.

Referring now to FIG. 6, a portion of a clock generating circuit, like that shown as 420 in FIG. 4, is shown in a block schematic diagram and designated by the general reference character 600. Clock generator 600 can receive input clock signal K. Such an input clock can be buffered by buffer 602 to provide clock signal CLK. In addition, clock signal CLK can be conditioned to by conditioning circuit 604 to generate a read clock CLK_R, and by conditioning circuit 606 to generate a write clock CLK_W. Such conditioning circuits (604 and 606) can include signal repeater circuits, and well as phase shift/delay circuits for appropriately timing the latching of write data and output of read data from a first memory cell array (e.g., 402-*a*).

Clock generator 600 can also include a phase change circuit 608 that receives input clock signal K. A phase change circuit can introduce a phase difference with respect to clock signal K, to thereby generate a phase delay signal DCLK. In the very particular example of FIG. 6, such a circuit is a delay lock loop (DLL) type circuit that introduces a 90° phase shift with respect to clock signal K. However, such a circuit could include phase lock loop and similar such circuits. Phase delay clock signal DCLK can be conditioned to by conditioning circuit 610 to generate a phase shifted read clock DCLK_R, and by conditioning circuit 612 to generate a phase shifted write clock DCLK_W. As noted above, such conditioning circuits (610 and 612) can include signal repeater circuits, and well as phase shift/delay circuits for appropriately timing the latching of write data and output of read data from another memory cell array (e.g., 402-*b*).

One skilled in the art would understand the complementary clock signals may be generated in a variety of ways, including but not limited to inverting their corresponding non-complementary counterpart, or generating clocks in the same fashion as FIG. 6 in response to complementary clock signal K#.

While the above embodiments have described arrangements that include two memory cell arrays accessed in phase shifted manner, the present invention should necessarily be limited to any particular number of memory cell arrays. To illustrate this point, a fifth embodiment will be described with reference to FIG. 7.

Figure 7:
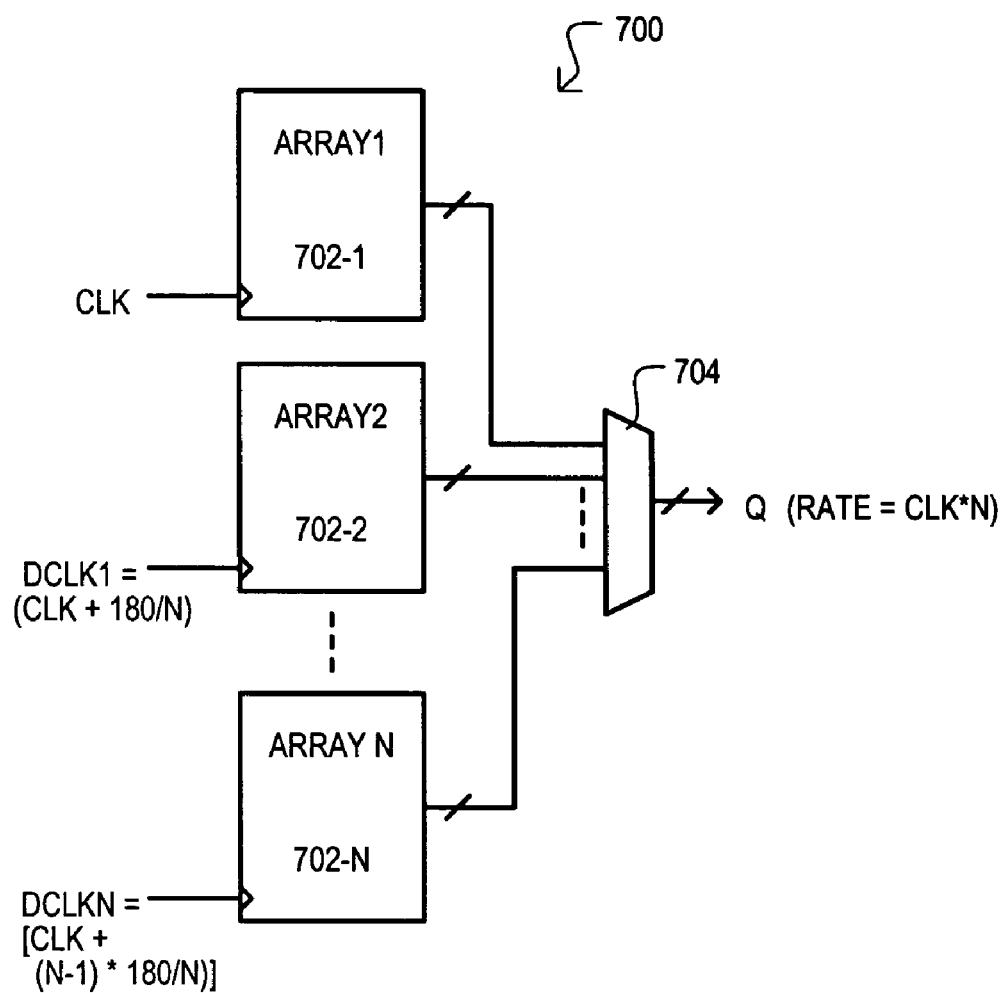
FIG. 7 is a block schematic diagram of a fifth embodiment of the present invention.
Figure 8:
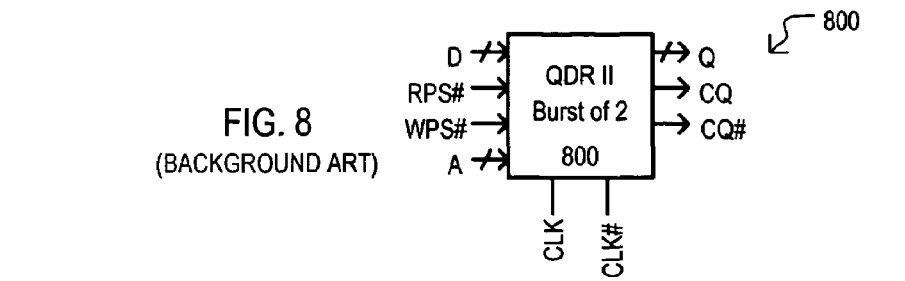
FIG. 8 is a block diagram of one example of a QDR™ SRAM.
Figure 9A:
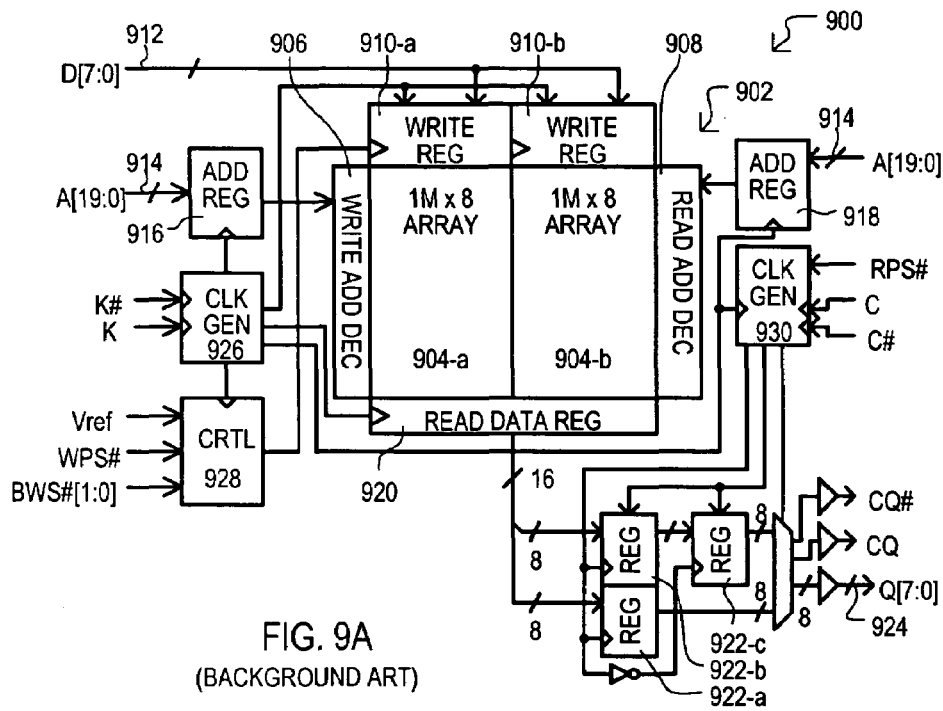
FIG. 9A is a block schematic diagram of one example of a QDR™ SRAM.
Figure 9B:
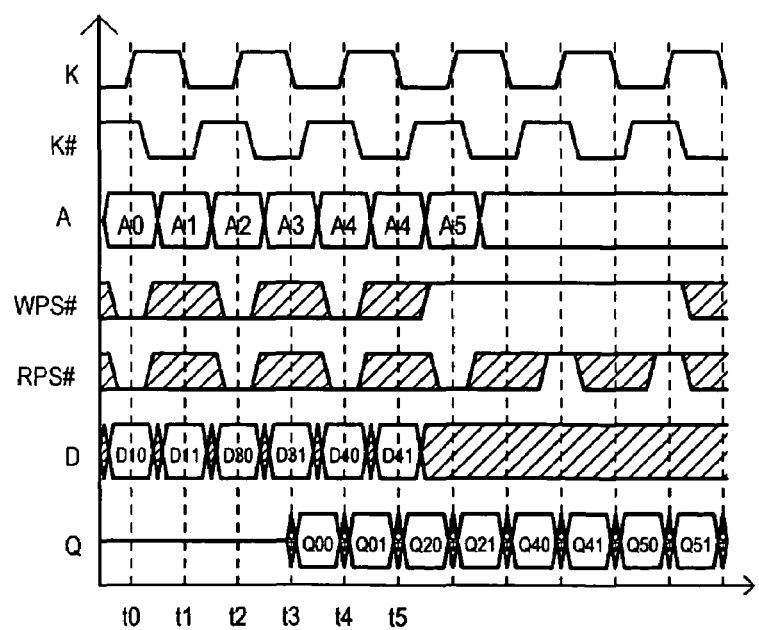
FIG. 9B is a timing diagram showing the operation of the QDR™ SRAM shown in FIG. 9A.

FIG. 7 is a block diagram showing a memory device 700 that can include N memory cell arrays (702-1 to 702-N), where N is a number greater than 1. Each memory cell array (702-1 to 702-N) can be accessed according to a different phase shift with respect to a clock CLK. It is understood that an "access" can include a read operation and/or a write operation, and preferably both.

Memory cell array 702-1 can be accessed according to a clock signal CLK. This can be essentially the same as memory cell array 202-*a* of FIG. 2A, 302-*a* of FIG. 3A, and 402-*a* of FIG. 4A.

However, a next memory cell array 702-2 in the order can be accessed by a phase delayed clock DCLK1 having a certain delay with respect to clock CLK, used to time accesses to previous memory cell array 702-1.

Such sequential phase shift accesses to memory cell arrays can proceed until a last memory cell array 702-N is accessed.

The very particular example of FIG. 7 shows an arrangement where memory cell arrays are accessed according to even phase shifts. Thus, a clock signal CLK1 can be delayed with respect to clock CLK by an amount (Array#−1)(180°/N). Thus, if N=2, delayed clock DCLK1 (Array#=2) would be delayed with respect to clock CLK by 90°. However, if N=4, delayed clock DCLK1 (Array#=2) would be delayed with respect to clock CLK by 450. In this way, more than two arrays may be accessed according to different phase shifts to increase data throughput.

The memory device 700 of FIG. 7 also shows an output multiplexer 704. Output multiplexer 704 can provide data Q at a rate of CLK*N. However, in the case where data are accessed in bursts of M, such a data rate can be CLK*N*M.

While the various embodiments of the present invention can enjoy wide application in a variety of industries, the embodiments may be particularly applicable to those applications having a need for memory device with a high data throughput, such as network search engines, as but one example.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
   at least a first memory cell array coupled to a read data bus that outputs read data and coupled to a separate write data bus that inputs write data, the at least first memory cell array accessing read data in response to a first type edge of a first clock and latching write data on at least the first type edge of the first clock; and
   at least a second memory cell array coupled to the read data bus and coupled to the write data bus, the at least second memory cell array accessing read data in response to a first type edge of a second clock and latching write data on at least the first type edge of the second clock, the second clock being phase shifted with respect to the first clock by less than 180°.

2. The memory device of claim 1, wherein:
   the first and second memory cell arrays comprise sections of n×m memory cells, and the write data bus includes m input data lines.

3. The memory device of claim 1, wherein:
   the first and second memory cell arrays comprise static random access memory (SRAM) cells.

4. The memory device of claim 1, wherein:
   the second clock is synchronous with, and phase shifted by about 90° with respect to the first clock.

5. The memory device of claim 1, wherein:
   the first memory cell array latches write data on both the first and second type edges of the first clock; and
   the second memory cell array latches write data on both the first and second type edges of the second clock.

6. The memory device of claim 1, further including:
   an address bus different than the read data bus and write data bus;
   a first address latch coupled between the address bus and the first memory cell array that latches an address value on the address bus in response to the first type edge of the first clock, and outputs an internal address; and
   a second address latch coupled between the first address latch and the second memory cell array that latches the internal address value in response to the first type edge of second clock.

7. The memory device of claim 1, further including:
   a multiplexer having one input coupled to the first memory cell array and another input coupled to the second memory cell array that outputs read data at least four times the rate of the first dock signal.

8. The memory device of claim 1, further including:
   an address bus different than the read data bus and write data bus;
   a first write address decoder coupled to the first memory cell array;
   a first write address register coupled to the address bus having an output coupled to a first write address decoder;
   a second write address decoder coupled to the second memory cell array; and
   a second write address register coupled to the first write address register having an output coupled to a second write address decoder.

9. A memory device, comprising:
   a number of N memory cell arrays, each comprising at least two sections, the number N being an integer greater than 1;
   a first write register that latches write data for a first of section of a first memory cell array on a rising edge of a first clock signal and latches write data for a second section of the first memory cell array on a falling edge of the first clock signal; and
   a second write register that latches write data for a first section of a second memory cell array on a rising edge of a second clock signal and latches write data for a second section of the second memory cell array on a falling edge of the second clock signal, the second clock signal have essentially the same frequency as the first clock signal but being phase shifted with respect to the first clock signal by about 180°/N.

10. The memory device of claim 9, wherein:
    the number N is greater than 2.

11. The memory device of claim 9, wherein:
    each memory cell array comprises M sections; and
    the first memory cell array and second memory cell array provide a burst of M read data values in response to one read address.

12. The memory device of claim 11, further including:
    a read output register circuit that receives M read data values from each memory cell array, and outputs such data as N*M words at a different phase with respect to one another.

13. The memory device of claim 9, further including:
    an address latch corresponding to each memory cell array, each address latch being arranged in series in a predetermined order and latching an address value according to a phase delay with respect to a previous address latch in the series, the phase delay being about 180°/N.

14. The memory device of claim 9, further including:

a multiplexer for outputting read data from the memory cell arrays at a frequency of N*F, where F is the frequency of the first and second clock signals.

15. A method of increasing data throughput in a memory device, the method comprising the steps of:

accessing a first of N memory cell arrays on a first-type edge and second-type edge of a first clock signal in response to one address value;

accessing a second of the N memory cell arrays on a first-type edge and second-type edge of a second clock signal in response to the same address value, the second clock signal having essentially the same frequency as the first clock signal but being phase shifted with respect to the first clock signal by about 180°/N; and outputting read data on a different bus than write data.

16. The method of claim 15, wherein:

in a read operation, the step of accessing the first of N memory cell arrays includes latching a read address on first-type edges of the first clock signal and latching write addresses on second-type edges of the first clock signal; and the step of accessing the second memory cell array includes latching a read address on first-type edges of the second clock signal and latching write addresses on second-type edges of the second clock signal.

17. The method of claim 15, further including:

in a burst mode, the step of accessing the first of N memory cell arrays includes accessing each of M sections of the first memory cell array in synchronism with different first-type and second-type edges of the first clock signal; and the step of accessing the second memory cell array includes accessing each of M sections of the second memory cell array in synchronism with different first-type and second-type edges of the second clock signal.

18. The method of claim 17, further including:

in a read operation, outputting N*M read data values within the duration of a first clock signal cycle in response to a single read address.

19. The method of claim 15, further including:

in a read operation, outputting read data from the first memory cell array in synchronism with an output clock having essentially the same frequency as the first clock signal, and outputting read data from the second memory cell array in synchronism with second output clock having essentially the same frequency as the first clock signal; wherein the read data is output from the second memory cell array with about a 180°/N phase shift with respect to the output clock.

20. The method of claim 15, wherein;

in a write operation, the step of accessing the first of N memory cell arrays includes latching write data on first-type edges and second-type edges of the first clock signal; and the step of accessing the second memory cell array includes latching write data on first-type edges and second-type edges of the second clock signal.

* * * * *